(12) United States Patent
Parks et al.

(10) Patent No.: US 7,807,514 B2
(45) Date of Patent: Oct. 5, 2010

(54) CCD WITH IMPROVED CHARGE TRANSFER

(75) Inventors: Christopher Parks, Rochester, NY (US); John P. McCarten, Penfield, NY (US); Joseph R. Summa, Hilton, NY (US)

(73) Assignee: Eastman Kodak Company, Rochester, NY (US)

(*) Notice: Subject to any disclaimer, the term of this patent is extended or adjusted under 35 U.S.C. 154(b) by 418 days.

(21) Appl. No.: 11/412,034

(22) Filed: Apr. 26, 2006

(65) Prior Publication Data

US 2007/0254413 A1 Nov. 1, 2007

(51) Int. Cl.
*H01L 21/339* (2006.01)
(52) U.S. Cl. .................. 438/146; 438/147; 438/549; 257/E21.617; 257/E21.644
(58) Field of Classification Search .................. 438/60, 438/75, 144, 146, 147, 549, FOR. 213; 257/E21.617, 257/E21.618, E21.644
See application file for complete search history.

(56) References Cited

U.S. PATENT DOCUMENTS

| 4,319,261 | A | | 3/1982 | Kub | |
|---|---|---|---|---|---|
| 4,420,773 | A | * | 12/1983 | Toyoda et al. | 386/118 |
| 4,910,569 | A | | 3/1990 | Erhardt | |
| 5,315,137 | A | | 5/1994 | Asaumi et al. | |
| 5,379,064 | A | | 1/1995 | Kato | |
| 5,401,679 | A | | 3/1995 | Fukusho | |
| 5,986,295 | A | * | 11/1999 | Nam | 257/215 |
| 6,818,483 | B2 | | 11/2004 | Wen et al. | |
| 2004/0080638 | A1 | * | 4/2004 | Lee | 348/272 |
| 2005/0064665 | A1 | * | 3/2005 | Han | 438/286 |

FOREIGN PATENT DOCUMENTS

| EP | 0 485 125 | | 5/1992 |
|---|---|---|---|
| JP | 03-155156 | * | 7/1991 |
| JP | 2001007318 | | 1/2001 |

\* cited by examiner

*Primary Examiner*—Matthew Smith
*Assistant Examiner*—Quovaunda Jefferson
(74) *Attorney, Agent, or Firm*—Peyton C. Watkins; Nancy R. Simon

(57) ABSTRACT

A method of forming a charge-coupled device including the steps of forming well or substrate of a first conductivity type; a buried channel of a second conductivity type; a plurality of first gate electrodes; partially coating the first gate electrodes with a mask substantially aligned to an edge of the first gate electrodes; implanting ions of the first conductivity type of sufficient energy to penetrate the first gates and into the buried channel; and a plurality of second gate electrodes covering regions each over the buried channel between the first gate electrodes.

12 Claims, 9 Drawing Sheets

CCD WITH IMPROVED CHARGE TRANSFER

FIELD OF THE INVENTION

The invention relates generally to the field of charge-coupled devices and, more particularly, to improving the charge transfer electric field under large gates.

BACKGROUND OF THE INVENTION

FIG. 1 shows a prior art, pseudo-2-phase, charge-coupled device (CCD) shift register. The CCD is typically fabricated as an n-type buried channel 330 at the surface in a p-type well or substrate 360. There are channel potential control gate electrodes 310, 320, 312, and 322 that are used to effect transfer of charge in the CCD. Gates 310 and 320 are electrically connected together to one voltage and gates 312 and 322 are electrically connected together to a second more negative voltage. The implant 350 under gates 320 and 322 modifies the channel potential to control the direction of charge transfer. If the gate 312 is physically very long, then electrons in the CCD feel a very small electric field pushing them forward towards the next gates 320 and 310. The small electric field leads to poor charge transfer efficiency and slow transfer times.

FIG. 2 shows a prior art solution to the small electric fields of FIG. 1. It also has an n-type buried channel 230 in a p-type well or substrate 260. There are channel potential control gate electrodes 270, 275, 280, and 285 that are used to effect transfer of charge in the CCD. Gates 270 and 275 are electrically connected together to one voltage and gates 280 and 285 are electrically connected together to a second more negative voltage. Additional implants 210 and 240 are used to create a step in the channel potential under gates 270 and 280. The extra step in the channel potential increases the electric field for improved charge transfer efficiency.

FIGS. 3 and 4 show the prior art fabrication process of FIG. 2. FIG. 3 shows a point in the fabrication process where only the first level of polysilicon gate 275 and 285 have been formed above the n-type buried channel 230. A blanket n-type implant (indicated by the vertical arrows) is used to increase the channel potential under where the second level polysilicon gate is to be placed. The first level gates 275 and 285 act as a self-aligned mask to block the implant. That implant forms the first step in the channel potential 240. There is also a photoresist mask level at this step in FIG. 3 to block the implant from the circuitry around the ends of the CCD, that mask is not shown in FIG. 3.

Next, in FIG. 4, a photoresist mask 290 is used to partially block an implant from penetrating the area where the second level polysilicon gate is to be placed. This forms the second channel potential step 210 in FIG. 2.

Prior art patents describing CCDs of similar processes shown in FIGS. 3 and 4 are U.S. Pat. Nos. 4,910,569; 5,315,137; 5,379,064; and 6,818,483.

The disadvantage of the fabrication process of FIGS. 3 and 4 is it requires two mask levels. It also requires the channel potential steps to be placed under the second level of polysilicon. Sometimes it is desired for the long gate to be of the first level of polysilicon, not the second.

Consequently, the present invention provides a manufacturing method to create a stepped channel potential under a long first level polysilicon gate using only one implant mask.

SUMMARY OF THE INVENTION

The present invention is directed to overcoming one or more of the problems set forth above. Briefly summarized, according to one aspect of the present invention, the invention resides in a method of forming a charge-coupled device comprising the steps of forming well or substrate of a first conductivity type; a buried channel of a second conductivity type; a plurality of first gate electrodes; partially coating the first gate electrodes with a mask substantially aligned to an edge of the first gate electrodes; implanting ions of the first conductivity type of sufficient energy to penetrate the first gates and into the buried channel; and a plurality of second gate electrodes covering regions each over the buried channel between the first gate electrodes.

The above and other objects of the present invention will become more apparent when taken in conjunction with the following description and drawings wherein identical reference numerals have been used, where possible, to designate identical elements that are common to the figures.

ADVANTAGEOUS EFFECT OF THE INVENTION

The present invention has the following advantages of manufacturing a camera or charge-couple device using the method of creating a stepped channel potential under a long first level polysilicon gate using only one implant mask.

DETAILED DESCRIPTION OF THE INVENTION

Figure 1:
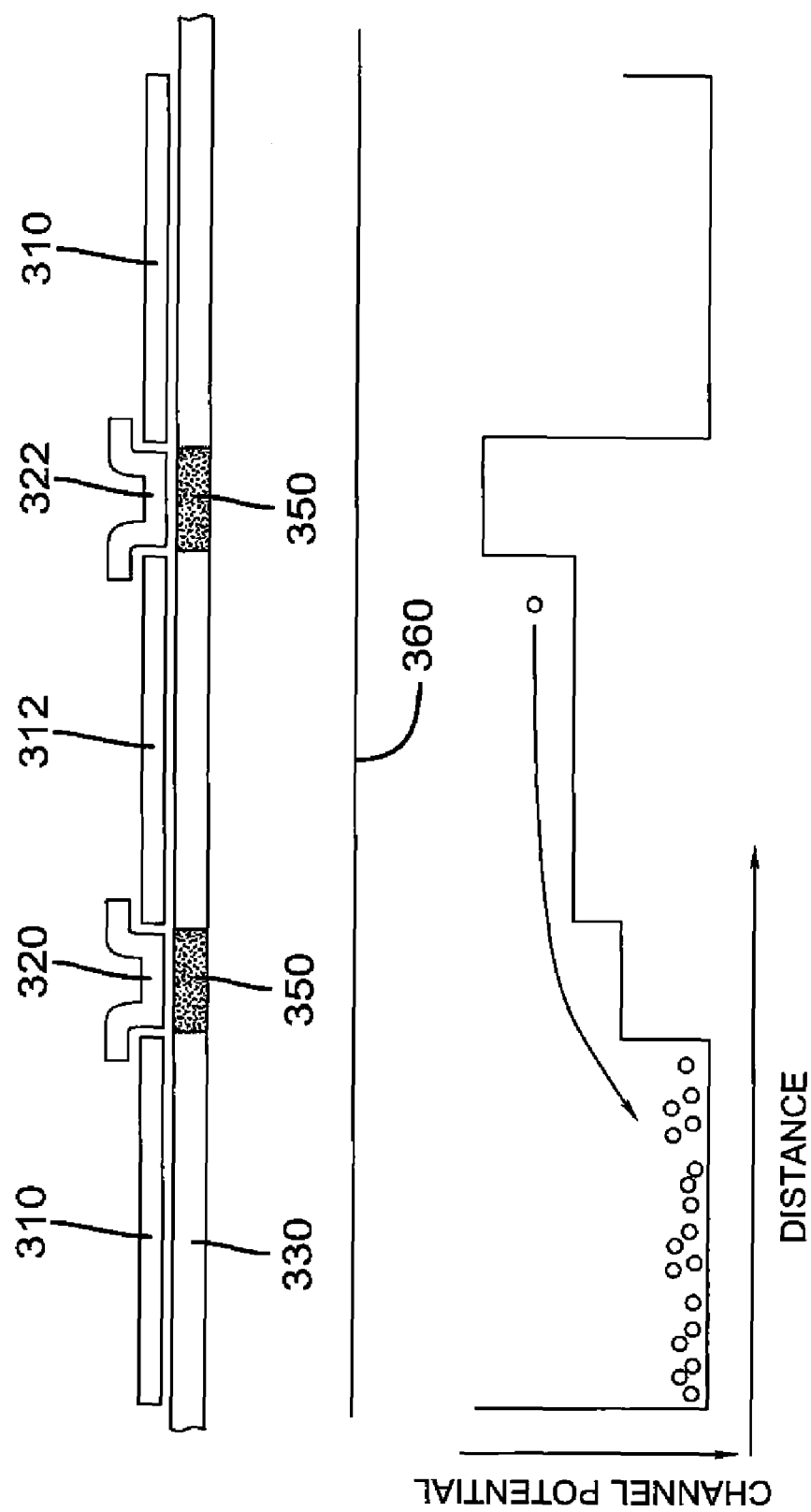
FIG. 1 is a prior art low electric field under a long gate.
Figure 2:
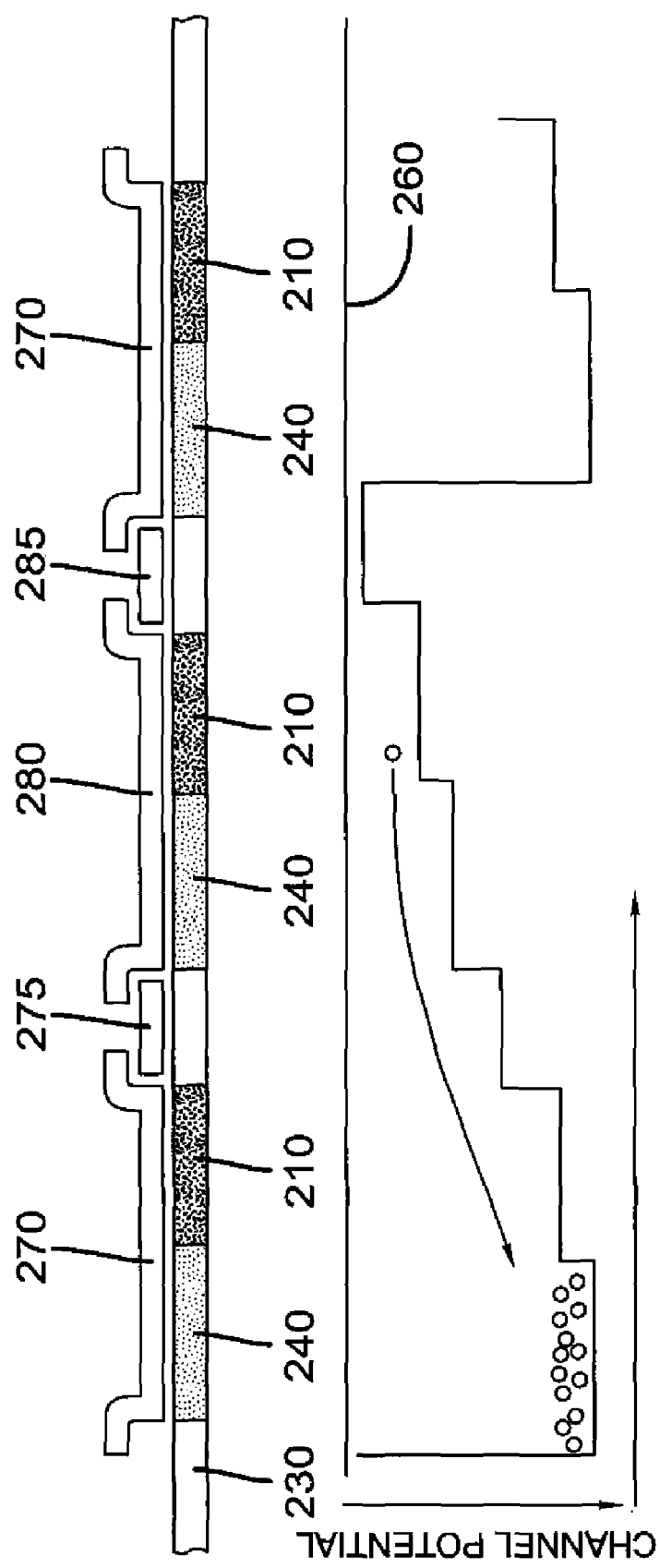
FIG. 2 is a prior art stepped channel potential under a second level polysilicon long gate.
Figure 3:
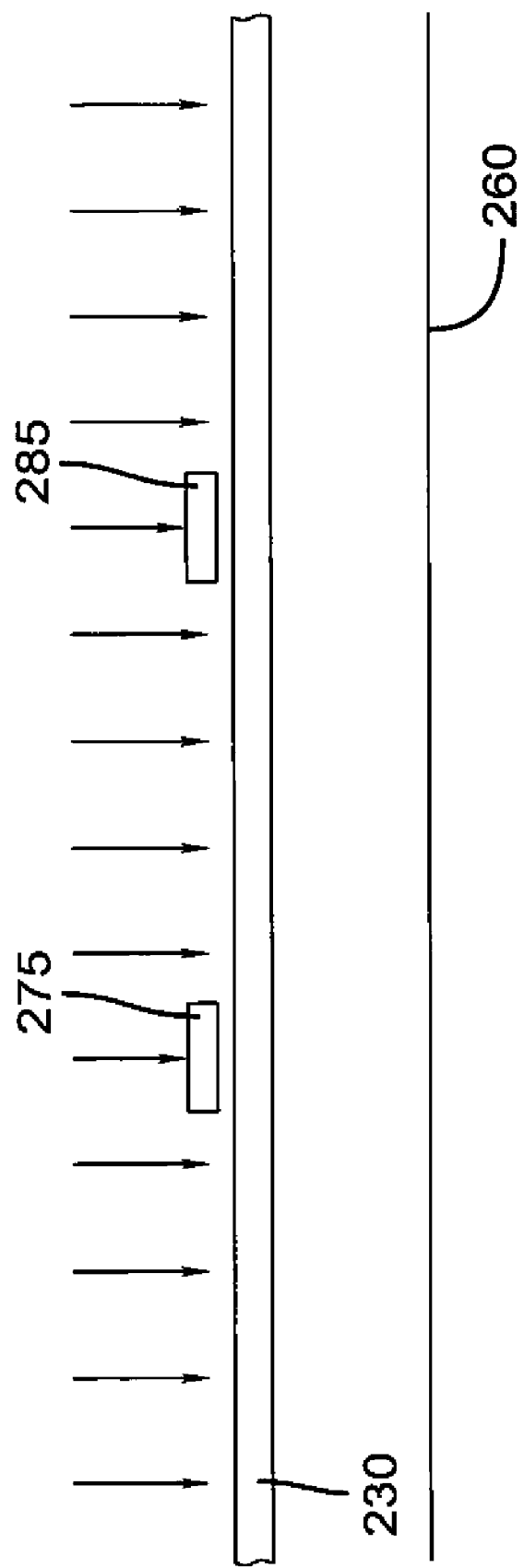
FIG. 3 is a prior art stepped channel potential manufacturing process.
Figure 4:
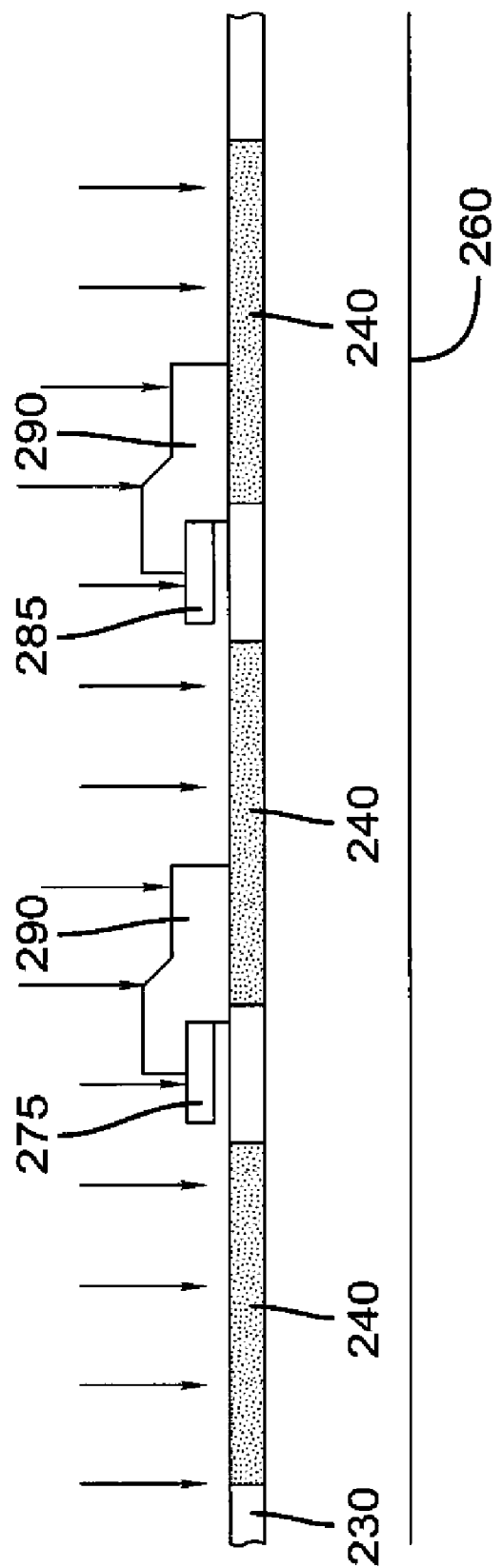
FIG. 4 is a prior art stepped channel potential manufacturing process.
Figure 5:
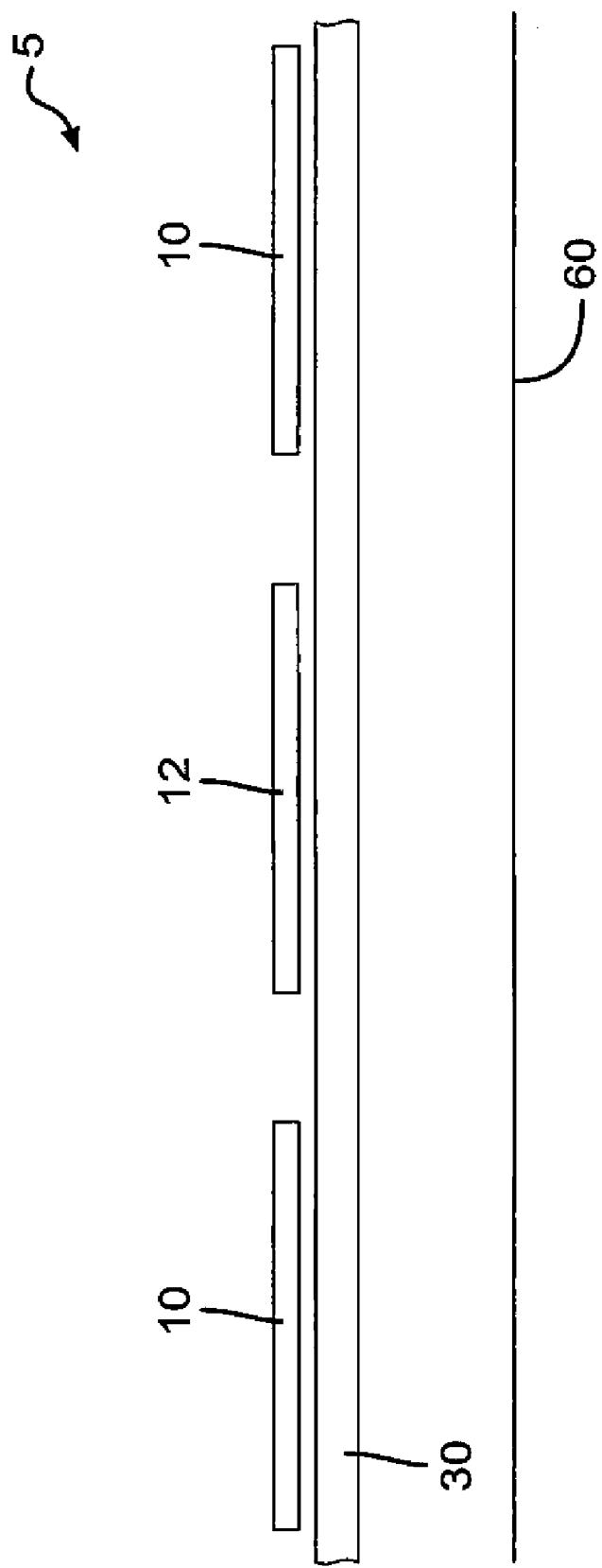
FIG. 5 is a step of the manufacturing process of the invention.

FIG. 5 shows the first step of the relevant portions of the manufacturing process of the present invention which produces a charge-coupled device image sensor 5. The CCD n-type buried channel 30 has already been formed on the p-type well or substrate 60. Also, the first level polysilicon gates 10 and 12 have already been patterned. It is noted that, although only three gates are shown, there are a plurality of each of the gates 10 and 12.

Figure 6:
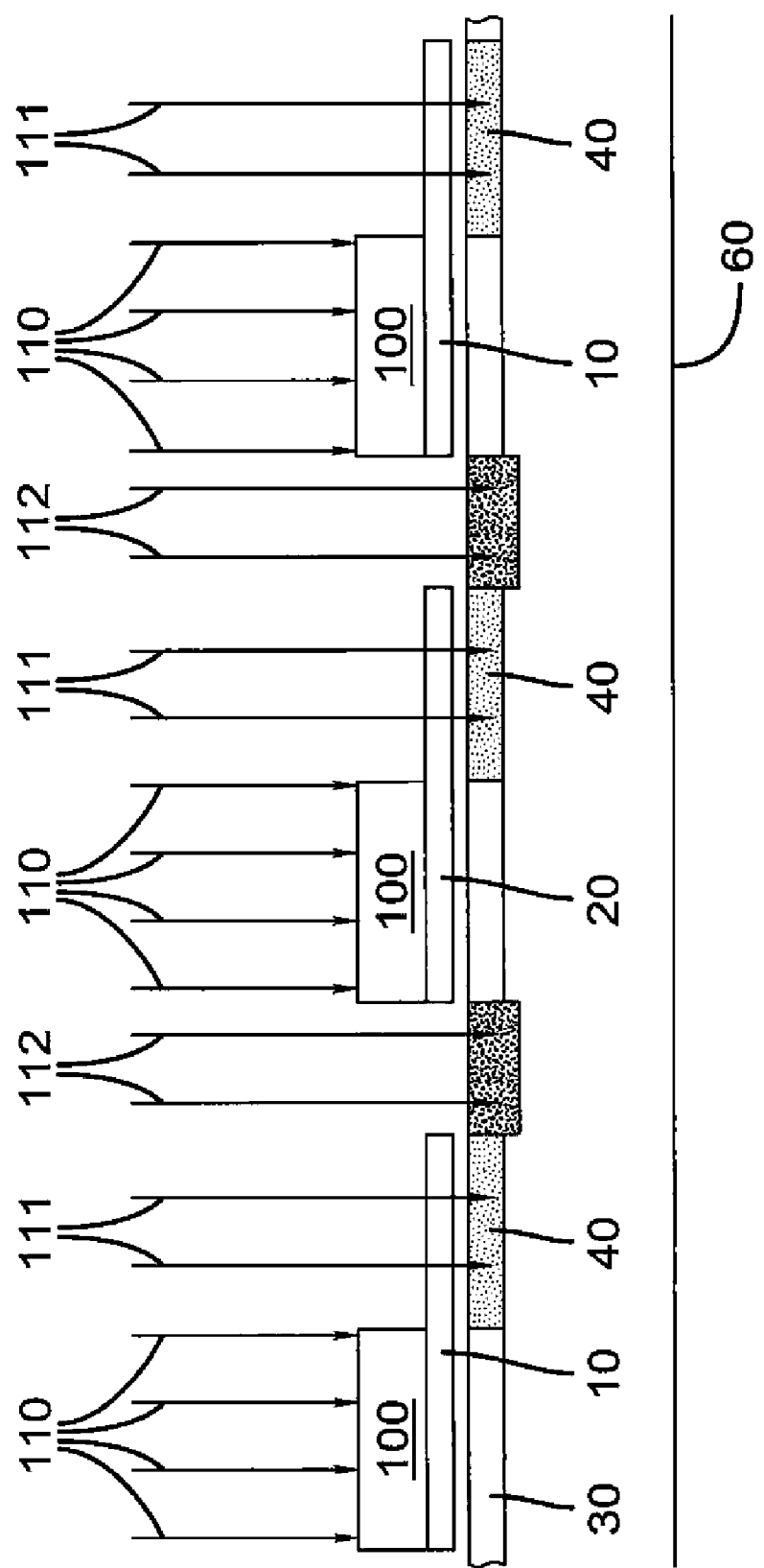
FIG. 6 is a high-energy implant step of the manufacturing process of the invention.

Next, in FIG. 6, a photoresist mask 100 is patterned on top of the first level polysilicon gates 10 and 20. The photoresist mask 100 is patterned such that one edge is aligned or substantially aligned with the edge of the first level polysilicon gates 10 and 20. The term substantially aligned is defined here as less than 0.25 μm. Modern lithography tools are now accurate enough that self-aligned implant techniques are no longer required. The photoresist mask 100 only covers a portion of the first level polysilicon gates 10 and 20.

A first high-energy p-type ion implant, represented by the arrows 110, 111 and 112, alters the buried channel 30 doping. The photoresist mask 100 totally blocks the implant ions 110. The ions 111 partially pass through the polysilicon gates 10 and 20. Because the ions 111 must pass through the polysilicon gates 10 and 20, there is less net n-type dopant 40 in the channel 30 than ions 112 which do not pass through any obstruction. Thus, ions 112 will be more heavily dope the channel than ions 111.

Figure 7:
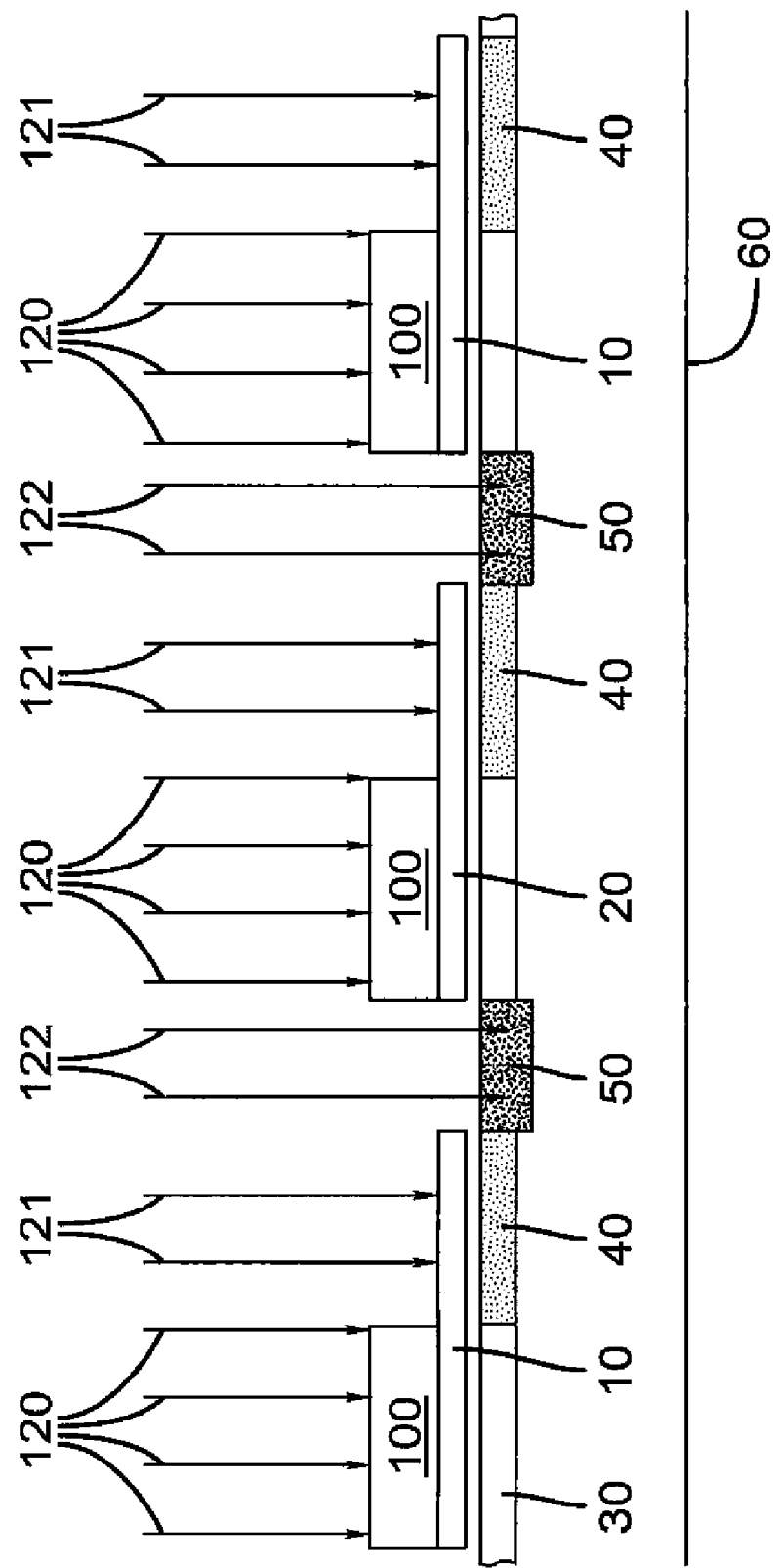
FIG. 7 is a lower energy implant step of the manufacturing process of the invention.
Figure 8:
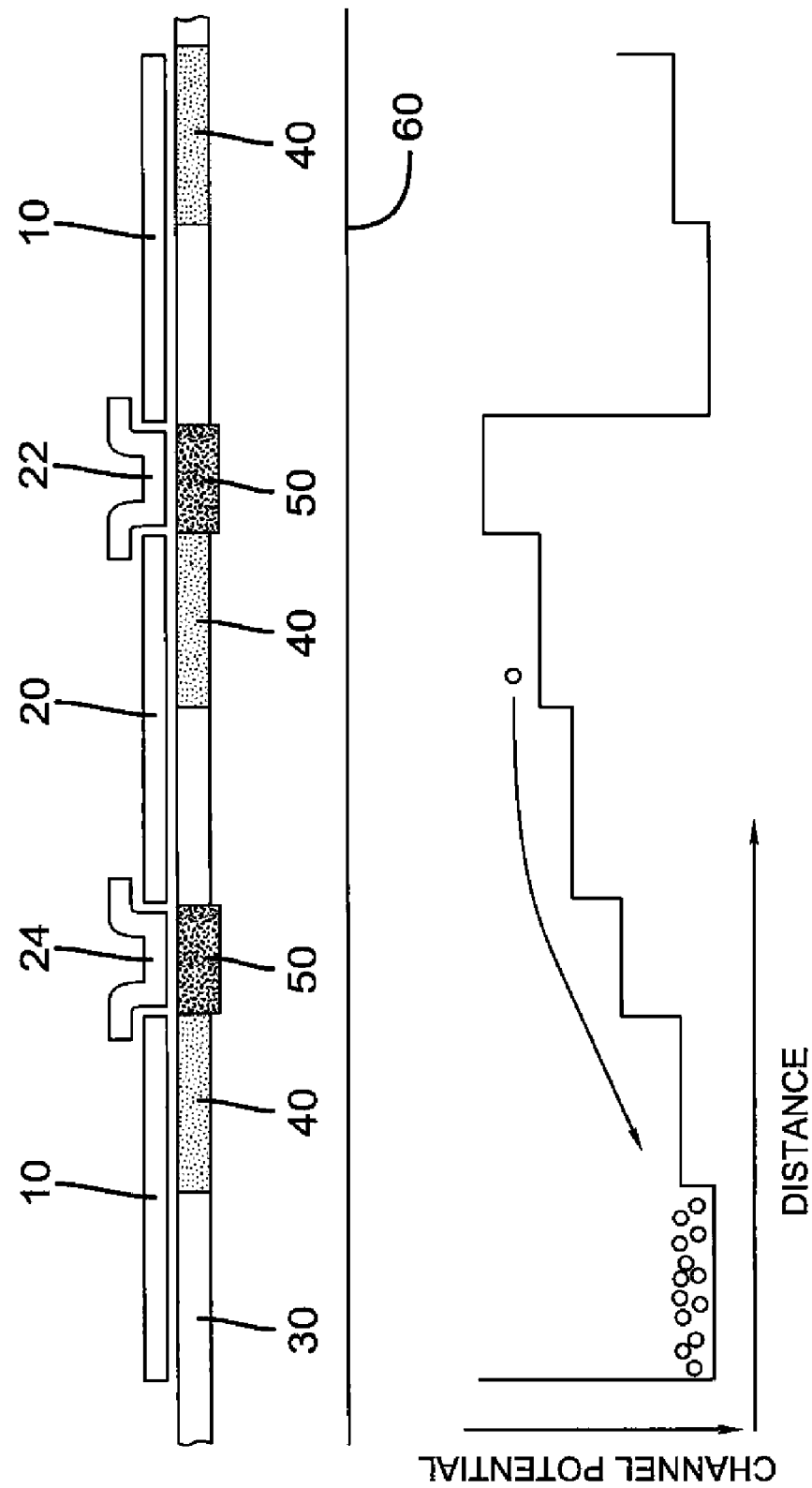
FIG. 8 is a stepped channel potential under a first level polysilicon gate.

The process up to this point will, in of itself, produce the desired stepped channel potential of FIG. 8. However, if a large potential step under gates 24 and 22 is desired, then a second low energy p-type ion implant is done as shown in FIG. 7. This implant is done while the photoresist mask 100 is still present. Thus it does not require an extra masking step as in the prior art. These are lower energy implant ions 120, 121, and 122. Ions 120 and 121 do not have enough energy to pass through the photoresist mask 100 or the first level polysilicon gates 10 and 20. Only ions 122 are implanted into the n-type buried channel 30 (area 50). This increases the height of the channel potential step under the second polysilicon gates 24 and 22. After the second low energy implant is done, the photoresist mask 100 is removed and the second level of polysilicon is deposited and patterned to form gates 24 and 22.

During the charge transfer process gates 10 and 24 are electrically connected and gates 20 and 22 are also electrically connected. Gates 10 and 24 are clock with opposite phase of gates 20 and 22 to effect the transfer of charge along the CCD channel 30 as is well known in the art of two-phase CCDs.

It is well recognized in the art of CCDs that an equivalent process would be to invert the type of the dopants. That is, to exchange all n-type implants for p-type implants and exchange all p-type implants for n-type implants.

Figure 9:
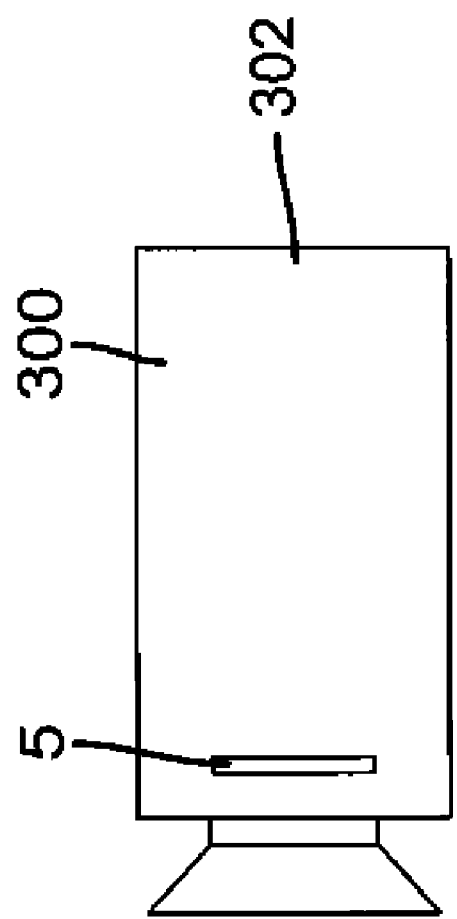
FIG. 9 is a side view of a digital camera containing the image sensor of the present invention.

Referring to FIG. 9, there is shown a digital camera 300 having a camera body 302 with the image sensor 5 of the present invention disposed therein for illustrating a typical commercial embodiment to which the ordinary consumer is accustomed.

The invention has been described with reference to a preferred embodiment. However, it will be appreciated that variations and modifications can be effected by a person of ordinary skill in the art without departing from the scope of the invention.

PARTS LIST 5 charge-coupled device image sensor
10 first level polysilicon gate
12 first level polysilicon gate
20 first level polysilicon gate
22 second level polysilicon gate
24 second level polysilicon gate
30 n-type buried channel
40 net n-type dopant
50 net n-type dopant
60 p-type well or substrate
100 photoresist mask
110 first high-energy p-type ion implant
111 first high-energy p-type ion implant
112 first high-energy p-type ion implant
120 lower energy implant ion
121 lower energy implant ion
122 lower energy implant ion
210 second channel potential step
230 n-type buried channel
240 first step in the channel potential
260 p-type well or substrate
270 channel potential control gate electrode
275 channel potential control gate electrode
280 channel potential control gate electrode
285 channel potential control gate electrode
290 photoresist mask
300 digital camera
302 camera body
310 channel potential control gate electrode
312 channel potential control gate electrode
320 channel potential control gate electrode
322 channel potential control gate electrode
330 n-type buried channel
350 implant
360 p-type well or substrate

The invention claimed is:

1. A method of forming a stepped channel potential in a charge-coupled device comprising:
    (a) forming a well or a substrate of a first conductivity type;
    (b) forming a buried channel of a second conductivity type;
    (c) forming a plurality of first gate electrodes;
    (d) partially coating the plurality of first gate electrodes with a mask substantially aligned to an edge of each first gate electrode;
    (e) producing the stepped channel potential in the buried channel by implanting ions of the first conductivity type with sufficient energy to simultaneously penetrate into the buried channel between the plurality of first gate electrodes and penetrate through the uncoated portions of the plurality of first gate electrodes and into the buried channel; and
    (f) forming a plurality of second gate electrodes covering regions of the buried channel between the plurality of first gate electrodes.

2. The method as in claim 1, further comprising prior to (f), producing a larger potential step in the stepped channel potential by implanting ions of the first conductivity type with sufficient energy to penetrate into the buried channel that is between the plurality of first gate electrodes but not penetrate the uncoated portions of the plurality of first gate electrodes.

3. The method as in claim 2, further comprising removing the mask after producing a larger potential step in the stepped channel potential and prior to (f).

4. The method as in claim 1, further comprising removing the mask prior to (f).

5. A method of forming a stepped channel potential in a charge coupled device comprising:
    (a) forming a well or a substrate of a first conductivity type;
    (b) forming a buried channel of a second conductivity type;
    (c) forming a plurality of first gate electrodes;
    (d) partially coating the plurality of first gate electrodes with a mask substantially aligned to an edge of each first gate electrode;
    (e) producing the stepped channel potential in the buried channel by implanting ions of the first conductivity type with sufficient energy to simultaneously penetrate into the buried channel that is between the plurality of first gate electrodes and penetrate through the uncoated portions of the plurality of first gate electrodes and into the buried channel;
    (f) producing a larger potential step in the stepped channel potential by implanting ions of the first conductivity type with sufficient energy to penetrate into the buried channel that is between the plurality of first gate electrodes but not penetrate the uncoated portions of the plurality of first gate electrodes; and
    (g) forming a plurality of second gate electrodes covering regions of the buried channel between the first gate electrodes.

6. The method as in claim 5, further comprising removing the mask prior to (g).

7. A method of forming a camera comprising:
(a) providing a camera body;
(b) providing a charge-coupled device in the camera body, the method of providing the charge-coupled device comprising:
(i) forming a well or a substrate of a first conductivity type;
(ii) forming a buried channel of a second conductivity type;
(iii) forming a plurality of first gate electrodes;
(iv) partially coating the plurality of first gate electrodes with a mask substantially aligned to an edge of each first gate electrode;
(v) producing a stepped channel potential in the buried channel by implanting ions of the first conductivity type with sufficient energy to simultaneously penetrate into the buried channel between the plurality of first gate electrodes and penetrate through the uncoated portions of the first gate electrodes and into the buried channel; and
(vi) forming a plurality of second gate electrodes covering regions of the buried channel between the plurality of first gate electrodes.

8. The method as in claim 7, further comprising prior to (vi), producing a larger potential step in the stepped channel potential by implanting ions of the first conductivity type with sufficient energy to penetrate into the buried channel that is between the plurality of first gate electrodes but not penetrate the uncoated portions of the plurality of first gate electrodes.

9. The method as in claim 8, further comprising removing the mask after producing a larger potential step in the stepped channel potential and prior to (vi).

10. The method as in claim 7, further comprising removing the mask prior to (vi).

11. A method of forming a camera comprising:
(a) providing a camera body;
(b) providing a charge-coupled device in the camera body, the method of providing the charge-coupled device comprising:
(i) forming a well or a substrate of a first conductivity type;
(ii) forming a buried channel of a second conductivity type;
(iii) forming a plurality of first gate electrodes;
(iv) partially coating the plurality of first gate electrodes with a mask substantially aligned to an edge of each first gate electrode;
(v) producing a stepped channel potential in the buried channel by, implanting ions of the first conductivity type with sufficient energy to simultaneously penetrate into the buried channel that is between the plurality of first gate electrodes and penetrate through the uncoated portions of the plurality of first gate electrodes and into the buried channel;
(vi) producing a larger potential step in the stepped channel potential by implanting ions of the first conductivity type with sufficient energy to penetrate into the buried channel that is between the plurality of first gate electrodes but not into the uncoated portions of the plurality of first gate electrodes; and
(vii) forming a plurality of second gate electrodes covering regions of the buried channel between the first gate electrodes.

12. The method as in claim 11, further comprising removing the mask prior to (vii).

* * * * *